United States Patent [19]
Chen

[11] Patent Number: 5,597,747
[45] Date of Patent: Jan. 28, 1997

[54] METHOD OF MAKING INVERTED THIN FILM TRANSISTOR USING BACKSICK EXPOSURE AND NEGATIVE PHOTORESIST

[75] Inventor: Mei-Soong Chen, Taichung, Taiwan

[73] Assignee: Industrial Technology Research Institute, Hsinchu, Taiwan

[21] Appl. No.: 572,809

[22] Filed: Dec. 15, 1995

[51] Int. Cl.$^6$ ................................................. H01L 21/84
[52] U.S. Cl. ........................................... 437/41; 437/173
[58] Field of Search .............................. 437/21, 40 TFI, 437/41 TFI, 173

[56] References Cited

U.S. PATENT DOCUMENTS

| | | | |
|---|---|---|---|
| 4,587,720 | 5/1986 | Cheneras-Paule et al. | 29/578 |
| 4,685,195 | 8/1987 | Szydlo et al. | 437/41 |
| 4,715,930 | 12/1987 | Diem | 437/101 |
| 4,767,723 | 8/1988 | Hinsberg, III et al. | 437/41 |
| 4,958,205 | 9/1990 | Takeda et al. | 357/23.7 |
| 5,091,337 | 2/1992 | Watanabe et al. | 437/181 |
| 5,103,330 | 4/1992 | Fukami et al. | 359/59 |
| 5,130,829 | 7/1992 | Shannon | 359/59 |
| 5,137,841 | 8/1992 | Takeda et al. | 437/41 |
| 5,289,016 | 2/1994 | Noguchi | 257/57 |
| 5,414,278 | 5/1995 | Kobayashi et al. | 257/7.2 |
| 5,441,905 | 8/1995 | Wu | 437/41 |

*Primary Examiner*—John Niebling
*Assistant Examiner*—Richard A. Booth
*Attorney, Agent, or Firm*—George O. Saile

[57] ABSTRACT

A substrate comprising material that is transparent to the radiation used to activate photoresist is selected. A gate electrode is formed on one surface of the substrate. Then an insulating layer and a layer of N+ silicon are deposited, followed by a coating of negative photoresist. The photoresist is now exposed, but the activating radiation is directed to it through the lower surface of the substrate. This results in a mask that allows a gap to be etched in the N+ silicon that is perfectly aligned with the gate electrode. The structure includes a layer of amorphous silicon together with a suitable protective layer and is completed by a conductive layer that is patterned to form connections to other parts of the circuit. The method depends on the transparency of silicon relative to metal so the wavelength of the light used to expose the photoresist must be taken into account.

13 Claims, 3 Drawing Sheets

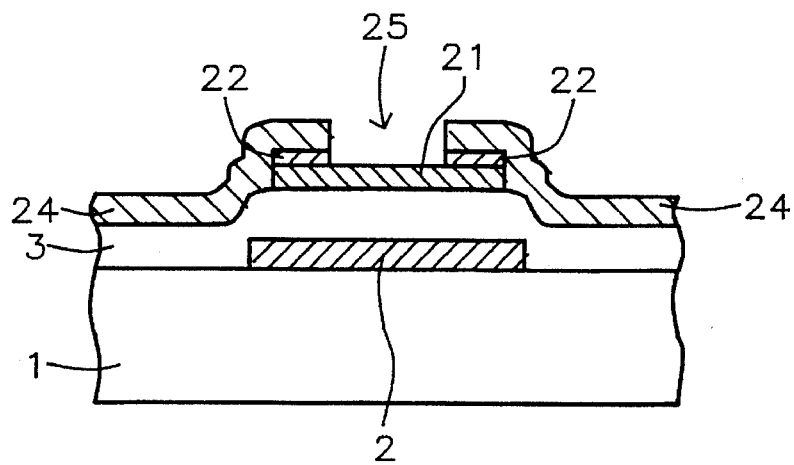
FIG. 1 - Prior Art
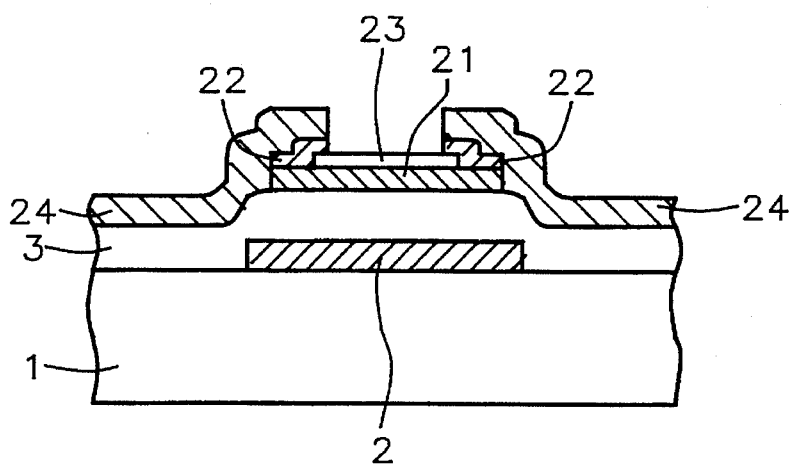
FIG. 2 - Prior Art
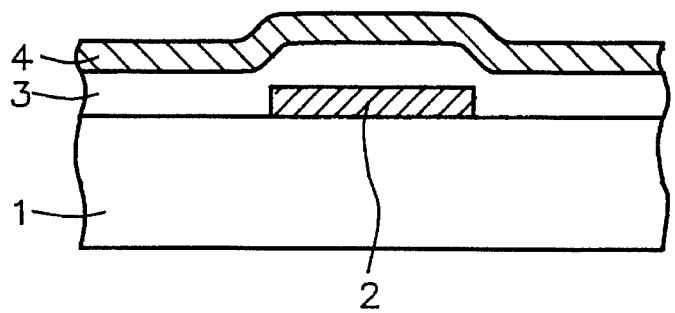
FIG. 3

METHOD OF MAKING INVERTED THIN FILM TRANSISTOR USING BACKSICK EXPOSURE AND NEGATIVE PHOTORESIST

BACKGROUND OF THE INVENTION (1) Field of the Invention

The invention relates to the general field of thin film transistors, more particularly to the formation of the source-drain gap by a self-alignment method.

(2) Description of the Prior Art

Thin film transistors (TFTs) have come into widespread use in, among other applications, liquid crystal displays. Most commonly they are fabricated by first laying down a gate electrode on an insulating substrate, then a layer of gate insulation, then a layer of undoped amorphous silicon and then a heavily doped layer of silicon (usually N+) over the preceding silicon layer.

Parasitic capacitances can appear in such a structure in unpredictable ways because of misalignment between source and drain. Additional tolerances must be allowed in the mask design to avoid possible non-contact problems and this can also introduce undesired parasitic capacitances.

An example of a TFT structure, typical of the prior art, is shown in schematic cross-section in FIG. 1. Gate electrode 2 has been formed on one surface of insulating substrate 1 and then overcoated with gate insulation layer 3 followed by amorphous silicon layer 21 and heavily doped (N+ or P+) layer of amorphous silicon 22. Layers 21 and 22 were then photolithographically shaped to the outside dimensions seen in FIG. 1, following which metal layer 24 was deposited over the structure. Conventional photolithography was then again used to partially remove layers 24 and 22 to form gap 25.

In addition to the misalignment and excess overlap problems already discussed, this method has the additional disadvantage that, if underetching occurs during the removal of layer 22, when gap 25 is forming, a certain amount of N+ layer 22 will be left on the surface of amorphous silicon layer 21, shorting it out, while, if overetching occurs, the thickness of layer 21 will be less than intended and performance of the device will be degraded.

The over/under etching problem has been partly solved in the prior art by the addition of an etch stop layer such as layer 23 in FIG. 2 typically comprising silicon nitride. This adds several steps to the process, notably the deposition and shaping of 23. Additionally, as shown, 23 does not fully cover amorphous silicon layer 21. Consequently, during the shaping of 23, the uncovered surfaces of 21 will be damaged by the plasma that is used to etch 23. This leads to an increase in the contact resistance between 21 and the N+ contacting layer 22.

In reviewing the prior art we have found that Fukami et al. (U.S. Pat. No. 5,103,330 Apr. 7 1992), Noguchi (U.S. Pat. No. 5,289,016 Feb. 22 1994), and Shannon (U.S. Pat. No. 5,130,829 Jul. 14, 1992) all describe thin film transistors, but none of these is self-aligned. Kobayashi et al. (U.S. Pat. No. 5,414,278 May 9, 1995) do describe a self-aligned structure but it is quite different from that of the present invention, being a thin film analog of the salicide (self-aligned silicide) structure, which the present invention is not. In the Kobayashi structure, both gate electrode and gate insulation act together as the self-alignment mask during the formation of the source and drain regions by means of ion implantation. We also note that the Kobayashi structure comprises polycrystalline silicon for the channel region.

Several other self-aligning structures and methods were also found. These include Takeda et al. (U.S. Pat. Nos. 4,958,205 Sep. 1990 and 5,137,841 Aug. 1992), Diem (U.S. Pat. No. 4,715,930 Dec. 1987), Szydlo et al. (U.S. Pat. No. 4,685,195 Aug. 1987), and Chenevas-Paule et al. (U.S. Pat. No. 4,587,720 May 1986). All of these inventions, while exposing photoresist by means of radiation that has been passed through the substrate, depend on the use of so-called positive photoresists (exposed portion is removed during development), either alone or in conjunction with additional steps using negative resists. Positive resists react to light in the visible portion of the spectrum. This makes them less convenient to use than negative photoresists that are sensitive to ultraviolet light. Additionally, as device dimensions shrink, processes that depend on visible light will run into resolution problems sooner than those using the shorter ultraviolet wavelengths.

SUMMARY OF THE INVENTION

It has been an object of the present invention to provide a thin film transistor wherein the gap between the source and drain regions is precisely the same as the width of the gate electrode and wherein said gap is located directly above said gate electrode.

A further object of the present invention has been to provide a TFT structure wherein the thickness of the amorphous silicon layer is precisely controlled.

Yet another object of the present invention has been to provide a TFT structure having low contact resistance between the amorphous silicon layer and the N+ silicon contacting layer.

A still further object of the present invention has been to provide an effective method for manufacturing such a structure.

These objects have been achieved by using a substrate that is transparent to the radiation used to activate photoresist. First, a gate electrode is formed on one surface of the substrate. Then a gate insulation layer and a contacting layer of N+ or P+ amorphous silicon are deposited, followed by a coating of photoresist. The photoresist is now exposed, but the activating radiation is directed to it through the lower surface of the substrate. This results in a mask that allows a gap to be etched in the N+ or P+ silicon that is perfectly aligned with the gate electrode. The structure is completed by depositing the layer of amorphous silicon, to its desired thickness level, together with suitable protective and conductive layers.

Because the present invention is a self-aligned structure, the parasitic capacitance formed between the gate and the source is decreased and then kept constant. Consequently, this TFT structure is well suited for the production of a large panel active matrix LCD.

BRIEF DESCRIPTION OF THE DRAWINGS

FIGS. 1 and 2 are schematic cross-sections of TFT designs typical of the prior art.

FIGS. 3 through 8 show successive steps in the formation of a self-aligned thin film transistor according to the method of the present invention.

DESCRIPTION OF THE PREFERRED EMBODIMENTS

Figure 4:
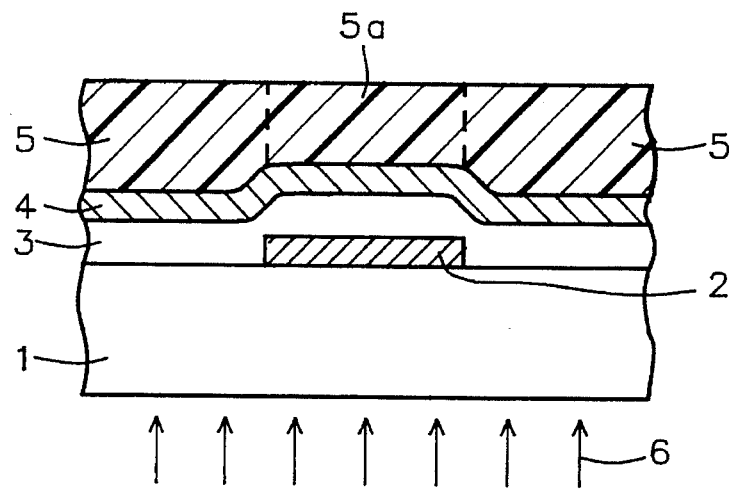

The present invention is a self-aligned thin film transistor that is formed by exposing a layer of negative photoresist with ultraviolet (or near-ultraviolet) light that has been directed to it from the underside of a transparent substrate. In this manner, the light must pass a preformed gate electrode on its way to the photoresist so said gate electrode acts as its own mask in defining the gap that will be etched between the source and drain electrodes. The light must also pass through a layer of N+ silicon before reaching the photoresist.

Silicon is relatively transparent to near-ultraviolet light, becoming more transparent as the wavelength increases. For example, at a wavelength of about 3300 Angstroms, a layer of silicon less than about 1,000 Angstroms thick will reduce the intensity of the light that has passed through it by a factor of about 12 (for a preferred thickness of 500 Angstroms), whereas at a wavelength of about 4360 Angstroms, a layer of silicon about 2,000 Angstrom units thick will reduce the intensity of the light that has passed through it by a factor of about 2.7. Thus, the wavelength of the light used to expose the photoresist needs to be taken into account when determining the maximum useful thickness of the N+ or P+ layer. The silicon absorption spectra upon which the above numbers are based may be found on page 441 of N. B. Hannay's book "Semiconductors" (Reinhold 1959).

Referring now to FIG. 3, we show there, in schematic cross-section, the starting point in a series of steps leading to the formation of an embodiment of the present invention. Substrate 1 comprises material that is transparent to light having a wavelength between about 3,000 and 8,000 Angstroms. While we have typically used Corning type 7059 or 1737 glass, other similar materials could also be used without changing the effectiveness of the present invention. The wavelength range specified is such as to be suitable for the activation of photoresist during photolithography.

Gate electrode 2 has been formed on the upper surface of substrate 1 by first depositing a layer of a conductive material such as chromium (although similar materials such as tantalum, aluminum, tungsten, molybdenum, or titanium could also have been used) and then patterning and etching it to the desired shape. The thickness of the gate electrode is typically in the range of from about 500 to 2,000 Angstroms.

Following formation of the gate electrode, gate insulation layer 3, comprising silicon nitride or silicon oxide, is deposited. The thickness of gate insulation layer 3 is typically between about 2,000 and 4,000 Angstroms. This is followed by the deposition of N+ or P+ amorphous silicon layer 4. It is convenient that there be no break in the vacuum between the depositions of N+ or P+ amorphous silicon layer 4 and gate insulation 3.

Referring now to FIG. 4, the structure (that was shown in FIG. 3) is given a coating 5 of negative photoresist. Near-ultraviolet light rays 6 are now directed to pass through transparent substrate 1, gate insulation layer 3, and N+ or P+ silicon layer 4 into photoresist coating 5. Gate electrode 2 acts as a mask for the light so portion 5a of the photoresist layer does not get activated and is removed when the photoresist is developed.

Figure 5:
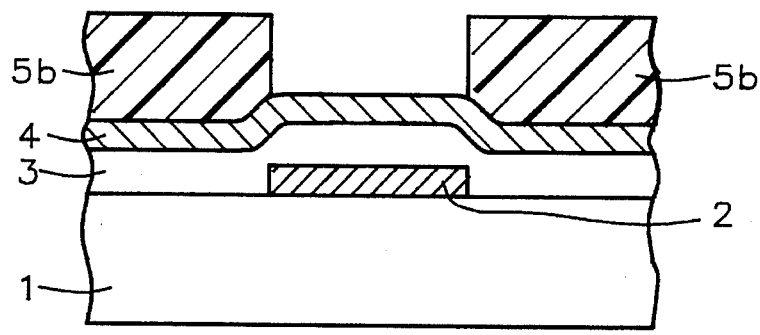
Figure 6:
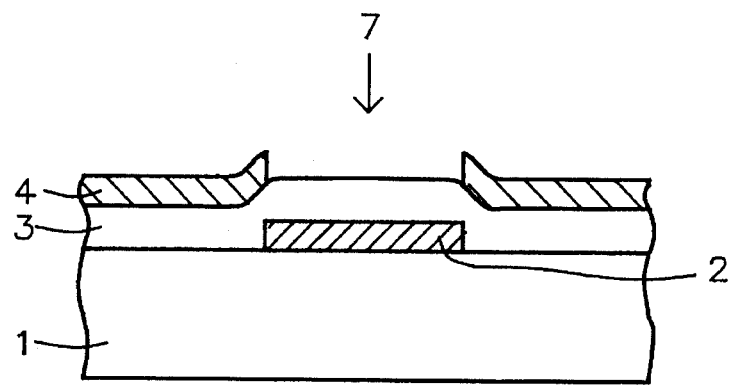

FIG. 5 shows the appearance of the structure after the photoresist has been developed. Layer 5b is what remains of the original photoresist layer. With this newly formed photoresist mask in place, the structure is etched in a gaseous plasma to remove all unprotected N+ or P+ silicon, giving it the appearance shown in FIG. 6 (after the photoresist has been stripped away). As can be seen, gap 7 has been formed in the N+ or P+ silicon layer down to the level of gate insulation layer 3. As a consequence of using the self-aligning method of the present invention, the edges of gap 7 are perfectly aligned with the outer edges of gate electrode 2. The parasitic capacitance between gate and source is decreased and then held constant by this method.

Figure 7:
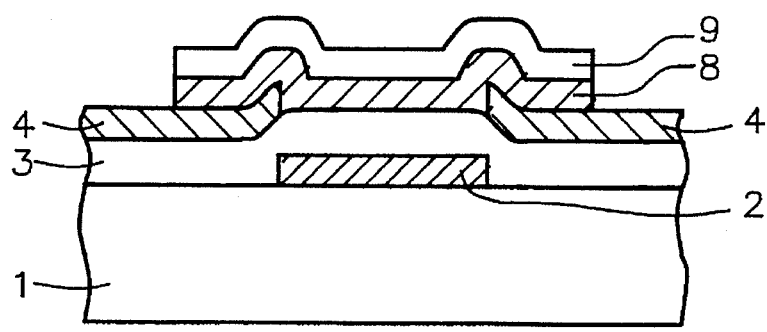

Referring now to FIG. 7, formation of the thin film transistor is continued by depositing a layer of amorphous silicon 8 and, with no interruption, a protective layer 9 over the structure and then etching these two layers to form channel 8 and protective insulation layer 9. Typically, the thickness of semiconductor layer 8 has been in the range from about 500 to 2,000 Angstroms.

Typically, protective layer 9 comprises silicon nitride but similar materials such as silicon oxide or silicon oxynitride could also be used without affecting the efficiency or workability of the present invention. The thickness of protective layer 9 is typically about 500 Angstroms.

Figure 8:
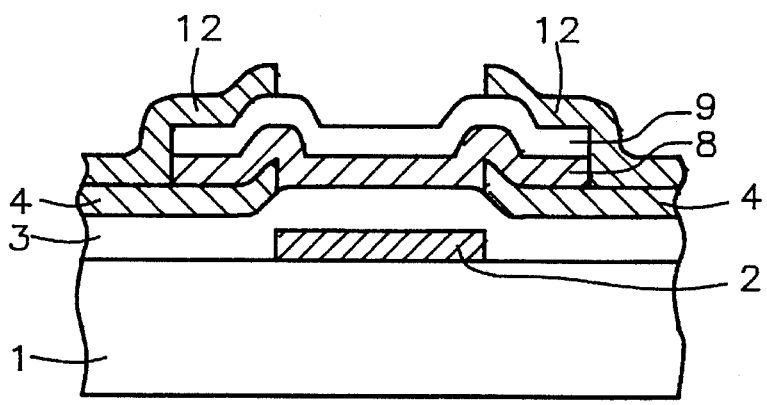
Figure 9:
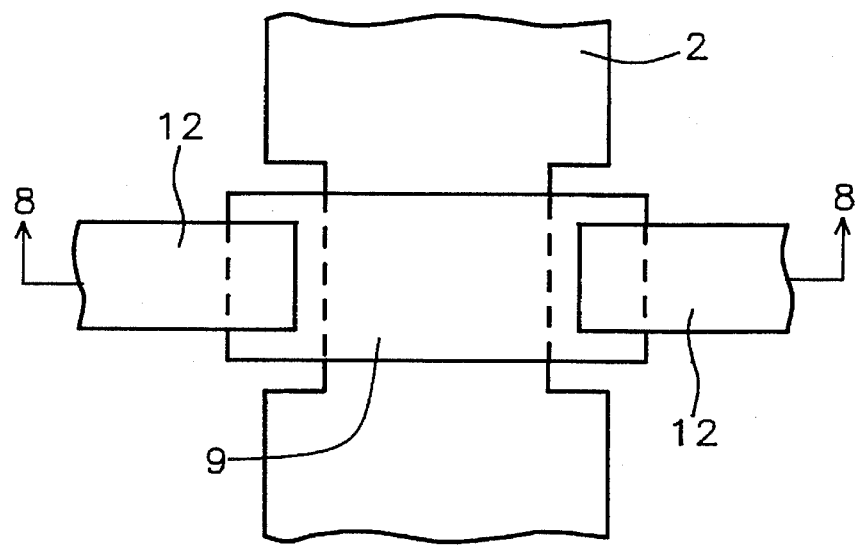
FIG. 9 is a plan view of the cross-section seen in FIG. 8.

A single mask is used for the etch definition of both the silicon nitride and amorphous silicon layers. Time mode etching is used to etch the amorphous silicon layer. To complete formation of the TFT, metallic layer 12 (FIG. 8), comprising aluminum or similar conductive material, or a two layer combination of metals such as chromium, aluminum, or molybdenum, is deposited over the structure and then formed into separate source and drain electrodes that contact N+ or P+ silicon layer 4. Layer 12 will be used to contact other parts of the overall circuit. A plan view is shown in FIG. 9, FIG. 8 being a cross-section of FIG. 9 through 8—8. Note that the structure of FIGS. 8 and 9 was formed by etching away those parts of N+ or P+ silicon layer that were not covered by metal layer 12.

The present invention can be applied to polycrystalline silcon TFTs. We note the following conditions to apply during such application:

(1) The strain point of the material that comprises substrate 1 should exceed the maximum temperature encountered during the production of this device.

(2) The material that comprises gate electrode 2 should be selected from the group of conductive materials whose melting points exceed the maximum temperature encountered during the production of this device.

(3) The deposition processes, wherein layer 4 is deposited onto layer 3 or where layer 9 is deposited onto layer 8, may be either continuous or not continuous.

While the invention has been particularly shown and described with reference to this preferred embodiment, it will be understood by those skilled in the art that various changes in form and details may be made without departing from the spirit and scope of the invention.

What is claimed is:

1. A method for forming a self-aligned thin film transistor comprising:

providing a substrate, having upper and lower surfaces, that is transparent to radiation used to activate photoresist;

depositing, then patterning and etching, a first matellic layer to form a gate electrode on said upper surface of said substrate;

depositing an insulating layer over said first metallic layer and said substrate;

then depositing a layer of doped semiconductor over said insulating layer;

coating said doped semiconductor layer with a layer of negative photoresist;

exposing said layer of photoresist to radiation that will activate it and that has been directed to said photoresist layer through said lower surface of said substrate; and then developing said layer of photoresist;

etching said doped semiconductor layer down to the level of said insulating layer in all areas not protected by photoresist thereby forming a gap between source and drain regions;

stripping away said layer of photoresist;

depositing a semiconducting layer over said doped semiconductor layer and said insulating layer; and then depositing a protective layer over said semiconducting layer;

patterning and then etching portions of said protective layer and said semiconducting layer down to the level of said doped semiconductor layer;

depositing a second metallic layer, on said protective layer and said doped semiconductor layer;

patterning and then etching said second metallic layer to form connections to circuitry outside of said thin film transistor; and etching that portion of said doped semiconductor layer that is not covered by the second metallic layer.

2. The method of claim 1 wherein said substrate is transparent to light in the wavelength range from about 1,500 Angstroms to about 8,000 Angstroms.

3. The method of claim 1 wherein the thickness of said first metallic layer is between about 500 and about 7,000 Angstroms.

4. The method of claim 1 wherein said first metallic layer is chosen from the group consisting of chromium, tantalum, molybdenum, tungsten, titanium, and aluminum.

5. The method of claim 1 wherein the thickness of said insulating layer is between about 500 and about 5,000 Angstroms.

6. The method of claim 1 wherein the thickness of said layer of doped semiconductor is less than about 1,000 Angstroms.

7. The method of claim 1 wherein the thickness of said layer of doped semiconductor is between about 300 and about 2,000 Angstroms.

8. The method of claim 1 wherein said layer of doped semiconductor comprises doped amorphous silicon or doped polycrystalline silicon.

9. The method of claim 1 wherein said semiconducting layer comprises amorphous silicon or polycrystalline silicon.

10. The method of claim 1 wherein the thickness of said semiconducting layer is between about 300 and about 4,000 Angstroms.

11. The method of claim 1 wherein the thickness of said protective layer is between about 60 and 4,000 angstroms.

12. The method of claim 1 wherein said protective layer comprises material taken from the group consisting of silicon nitride, silicon oxide, and silicon oxynitride.

13. The method of claim 1 further comprising:

integrating said thin film transistor within the circuitry of a liquid crystal display.

* * * * *

UNITED STATES PATENT AND TRADEMARK OFFICE
CERTIFICATE OF CORRECTION

PATENT NO. : 5,597,747
DATED : 1/28/97
INVENTOR(S) : Mei-Soong Chen

It is certified that error appears in the above-indentified patent and that said Letters Patent is hereby corrected as shown below:

On the title page, item [54] and column 1, line 2, change "BACKSICK" to --BACKSIDE Signed and Sealed this Second Day of September, 1997

Attest:

BRUCE LEHMAN

Attesting Officer

Commissioner of Patents and Trademarks